United States Patent
Plößl (10) Patent No.: US 9,680,049 B2
(45) Date of Patent: Jun. 13, 2017

(54) METHOD FOR PRODUCING AN OPTOELECTRONIC SEMICONDUCTOR CHIP AND OPTOELECTRONIC SEMICONDUCTOR CHIP

(71) Applicant: OSRAM Opto Semiconductors GmbH, Regensburg (DE)

(72) Inventor: Andreas Plößl, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/773,921

(22) PCT Filed: Mar. 19, 2014

(86) PCT No.: PCT/EP2014/055528
§ 371 (c)(1),
(2) Date: Sep. 9, 2015

(87) PCT Pub. No.: WO2014/173590
PCT Pub. Date: Oct. 30, 2014

(65) Prior Publication Data
US 2016/0027959 A1   Jan. 28, 2016

(30) Foreign Application Priority Data

Apr. 26, 2013   (DE) .................. 10 2013 104 270

(51) Int. Cl.
*H01L 33/00* (2010.01)
*B23K 26/00* (2014.01)
(Continued)

(52) U.S. Cl.
CPC ........ *H01L 33/007* (2013.01); *B23K 26/0057* (2013.01); *B23K 26/40* (2013.01);
(Continued)

(58) Field of Classification Search
CPC ... H01L 33/007; H01L 33/32; H01L 33/0095; H01L 2933/0033; H01S 5/343;
(Continued)

(56) References Cited

U.S. PATENT DOCUMENTS 7,446,344 B2    11/2008 Fehrer et al.
8,216,867 B2 *  7/2012 Donofrio ............ H01L 33/0079
                                                      257/E21.347
(Continued)

FOREIGN PATENT DOCUMENTS

CN    101621025 A    1/2010
CN    102130253 A    7/2011
(Continued)

OTHER PUBLICATIONS

"LED Sapphire Wafer Scribing Using 355 nm Lasers," Spectra-Physics Datasheet, Application Focus, Industrial Laser Applications Lab, No. 8, 2011, 2 pages.

(Continued)

*Primary Examiner* — Jerome Jackson, Jr.
*Assistant Examiner* — Bo Fan
(74) *Attorney, Agent, or Firm* — Slater Matsil, LLP (57) ABSTRACT

In at least one embodiment, a method is designed to produce optoelectronic semiconductor chips. A carrier assembly, which is a sapphire wafer, is produced. A semiconductor layer sequence is applied to the carrier assembly. The carrier assembly and the semiconductor layer sequence are divided into the individual semiconductor chips. The dividing is implemented by producing a multiplicity of selectively etchable material modifications in the carrier assembly in separation region(s) by focused, pulsed laser radiation. The laser radiation has a wavelength at which the carrier assembly is transparent. The dividing includes wet chemically etching the material modifications, such that the carrier (Continued)

assembly is singulated into individual carriers for the semiconductor chips solely by the wet chemical etching or in combination with a further material removal method.

12 Claims, 6 Drawing Sheets

(51) Int. Cl.
  *H01L 33/32* (2010.01)
  *H01S 5/02* (2006.01)
  *B23K 26/40* (2014.01)
  *H01S 5/343* (2006.01)
  *B23K 103/16* (2006.01)
  *B23K 103/00* (2006.01)

(52) U.S. Cl.
  CPC .......... *H01L 33/0095* (2013.01); *H01L 33/32* (2013.01); *H01S 5/0203* (2013.01); *H01S 5/0213* (2013.01); *H01S 5/343* (2013.01); *B23K 2203/16* (2013.01); *B23K 2203/172* (2015.10); *B23K 2203/50* (2015.10); *H01L 2933/0033* (2013.01)

(58) Field of Classification Search
  CPC . H01S 5/0213; H01S 5/0203; B23K 2203/50; B23K 2203/16; B23K 2203/172; B23K 26/40; B23K 26/0057
  USPC ........................................ 438/29, 33; 257/99
  See application file for complete search history.

(56) References Cited

U.S. PATENT DOCUMENTS

| | | | |
|---|---|---|---|
| 2007/0148803 A1 | 6/2007 | Yakushiji et al. | |
| 2007/0298529 A1 | 12/2007 | Maeda et al. | |
| 2008/0290359 A1 | 11/2008 | Inoue et al. | |
| 2009/0212316 A1* | 8/2009 | Braune ................ | H01L 24/97 257/99 |
| 2010/0015782 A1 | 1/2010 | Yu et al. | |
| 2012/0061010 A1 | 3/2012 | Gokita | |
| 2012/0135553 A1 | 5/2012 | Felker et al. | |
| 2013/0023076 A1* | 1/2013 | Uchiyama ........... | H01L 33/0095 438/29 |
| 2015/0243843 A1 | 8/2015 | Park et al. | |

FOREIGN PATENT DOCUMENTS

| | | | |
|---|---|---|---|
| CN | 102398313 A | | 4/2012 |
| DE | 102005041064 A1 | | 3/2007 |
| DE | 102008010512 A1 | | 8/2009 |
| DE | 112010002423 T5 | | 1/2013 |
| EP | 2637222 A2 | | 9/2013 |
| JP | 201216726 A | | 1/2012 |
| KR | 20120102897 A | * | 9/2012 |
| KR | 1020120102897 A | | 9/2012 |
| WO | 03030271 A2 | | 4/2003 |
| WO | 2012060619 A2 | | 5/2012 |

OTHER PUBLICATIONS

"Selektives Laserätzen von Glass and Saphir (Selective Laser Etching of Glass and Sapphire)," Fraunhofer Institute for Laser Technology ILT Datasheet, Sep. 2010, 2 pages.

Hörstmann-Jungemann, M., et al., "3D-Microstructuring of Sapphire using fs-Laser Irradiation and Selective Etching," Journal of Laser Micro/Nanoengineering (JLMN), vol. 5, No. 2, Jun. 2010, pp. 145-149.

Juodkazis, S., et al., "Control over the Crystalline State of Sapphire," Advanced Materials, vol. 18, Issue 11, Apr. 12, 2006, pp. 1361-1364.

Kojima, A., et al., "A Fully Integrated Novel Wafer-Level LED Package (WL2P) Technology for Extremely Low-cost Solid State Lighting Devices," 2012 IEEE International Interconnect Technology Conference (IITC), Jun. 4-6, 2012, 3 pages.

Moser, R., et al., "Sub-surface channels in sapphire made by ultraviolet picosecond laser irradiation and selective etching," Optics Express, vol. 19, No. 24, Nov. 21, 2011, pp. 24738-24745.

Wortmann, D., et al., "Micro- and nanostructures inside sapphire by fs-laser irradiation and selective etching," Optics Express, vol. 16, No. 3, Feb. 4, 2008, pp. 1517-1522.

* cited by examiner

METHOD FOR PRODUCING AN OPTOELECTRONIC SEMICONDUCTOR CHIP AND OPTOELECTRONIC SEMICONDUCTOR CHIP

This patent application is a national phase filing under section 371 of PCT/EP2014/055528, filed Mar. 19, 2014, which claims the priority of German patent application 10 2013 104 270.8, filed Apr. 26, 2013, each of which is incorporated herein by reference in its entirety.

TECHNICAL FIELD

A method is provided for producing an optoelectronic semiconductor chip. A semiconductor chip produced accordingly is additionally provided.

SUMMARY

Embodiments of the invention provide a method, which allows efficient and versatile production of semiconductor chips.

According to at least one embodiment, the method serves to produce an optoelectronic semiconductor chip. The semiconductor chip preferably comprises a light-emitting device such as a light-emitting diode, or LED for short, or indeed a laser diode, or LD for short.

According to at least one embodiment, the method comprises the step of providing a carrier assembly. The carrier assembly comprises a multiplicity of individual carriers for the semiconductor chips or for groups of semiconductor chips. In the carrier assembly the individual carriers are connected firmly together mechanically. The carrier assembly is particularly preferably a sapphire wafer. In other words, the carrier assembly and thus also the carriers for the semiconductor chips are each formed from sapphire.

According to at least one embodiment, the method comprises the step of applying one or more semiconductor layer sequences to the carrier assembly. Application particularly preferably comprises epitaxial growth. In other words, the carrier assembly and thus the sapphire wafer then comprise a growth substrate for the semiconductor layer sequence. Alternatively, the semiconductor layer sequence may also be otherwise applied to the carrier assembly, for example, by means of soldering, adhesion or wafer bonding.

The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$, wherein in each case $0 \leq n \leq 1$, $0 \leq m \leq 1$ and $n+m \leq 1$ applies. The semiconductor layer sequence may comprise dopants and additional constituents. For simplicity's sake, however, only the essential constituents of the crystal lattice of the semiconductor layer sequence are indicated, i.e., Al, As, Ga, In, N or P, even if these may in part be replaced and/or supplemented by small quantities of further substances.

According to at least one embodiment, the semiconductor layer sequence comprises at least one active zone for generating electromagnetic radiation. The active zone may comprise a pn-junction or a quantum well structure.

According to at least one embodiment, the method comprises the step of dividing the carrier assembly and semiconductor layer sequence into the individual semiconductor chips or into the groups of semiconductor chips. Division in particular of the carrier assembly here proceeds in separation regions, which are formed between adjacent semiconductor chips. It is possible for the separation regions to be completely removed or detached during division.

According to at least one embodiment, the step of dividing the carrier assembly comprises the sub-step of producing a multiplicity of selectively etchable material modifications in the carrier assembly. This production of material modifications proceeds in the separation regions preferably by focused and pulsed laser radiation. The pulses of laser radiation in particular comprise femtosecond pulses, picosecond pulses or nanosecond pulses.

According to at least one embodiment, the laser radiation has a wavelength at which the carrier assembly and/or the semiconductor layer sequence is/are radiation-transmissive, in particular clear and transparent. Action on the material of the carrier assembly then proceeds, for example, through nonlinear optical effects in the material, brought about by high intensities of laser radiation at a focal point of the laser radiation.

According to at least one embodiment, division of the carrier assembly comprises the step of wet chemically etching the material modifications. This wet chemical etching step follows the step of producing the material modifications. During the etching, only the regions of the carrier assembly with the material modifications are etched, particularly preferably selectively, for example, with an etching selectivity of at least 1:1000 or at least 1:5000, and not the remaining material of the carrier assembly.

In at least one embodiment, the method is designed to produce a plurality of optoelectronic semiconductor chips and comprises at least the following steps:

A) providing a carrier assembly, which is a sapphire wafer,
B) applying to the carrier assembly a semiconductor layer sequence preferably based on AlInGaN with at least one active zone for generating electromagnetic radiation, and
C) dividing the carrier assembly and the semiconductor layer sequence into the individual semiconductor chips or into groups of semiconductor chips in the separation regions between adjacent semiconductor chips or between adjacent groups.

Step C) here comprises at least the following sub-steps:
D) in each case producing a multiplicity of selectively etchable material modifications in the carrier assembly in the separation regions by focused, pulsed laser radiation, wherein the laser radiation has a wavelength at which the carrier assembly is transparent, and
E) wet chemically etching the material modifications, such that the carrier assembly is singulated into individual carriers for the semiconductor chips or for the groups solely by the wet chemical etching or in combination with a further material removal method.

The individual method steps are preferably carried out in the stated order.

Sapphire is used as the growth substrate for semiconductor elements both in high frequency technology and in optoelectronics. While in high frequency technology sapphire in the form of silicon-on-sapphire slices is often used as a carrier for a thin silicon layer for the actual components, optoelectronics uses sapphire as a growth substrate for compound semiconductor materials such as AlGaInN.

To singulate the components produced in the slice assembly or in the wafer assembly, only scribing and breaking are practicable due to the great hardness of sapphire. Scribing here proceeds in particular by means of thermally induced scribe marks produced using a laser. Due to the breaking process, sapphire is substantially only divisible along straight lines. To prevent or reduce fractures and damage at corners, the straight break lines must extend substantially at right angles to one another. Therefore, when viewed in plan view, only rectangular semiconductor chip base areas are practicable. Other basic shapes offer advantages in light outcoupling, however, and are desired for optoelectronic semiconductor components in many applications. In addition, breaking leads to comparatively smooth break facets, which are typically stepped. However, at smooth break facets a high fraction of the radiation undergoes total reflection, which may reduce light outcoupling efficiency.

Finally, the mechanical separation of sapphire requires relatively wide separating trenches, from which the semiconductor layer sequence has to be removed in particular before singulation in order to prevent damage to the semiconductor layer sequence. These separating trenches typically have a width of the order of magnitude of 50 µm. These separating trenches constitute a lost chip area, which leads to higher semiconductor chip manufacturing costs.

In the method described here, the semiconductor chips are singulated in a process comprising at least two stages. In the first step, material modifications are induced by laser writing. These material modifications can be efficiently etched in a second step. Since the laser writing may be "In-volume Selective Laser Etching", or ISLE for short, separation regions, and thus side faces and semiconductor chip shapes, of virtually any desired shape may be produced in the carrier assembly. Furthermore, such separation regions have only a small width, so increasing the area of a wafer usable for the semiconductor layer sequence of the semiconductor chip.

The ISLE method may be performed, for example, as described in the publication by Hörstmann-Jungemann et al. in Journal of Laser Micro-Nano Engineering, Volume 5, No. 2, 2010 Edition, pages 145-149. The disclosure content of this publication is included by reference.

According to at least one embodiment, the semiconductor layer sequence is partially or completely removed at the separation regions prior to the dividing step. In particular, the semiconductor layer sequence is also removed in a narrow strip next to the separation regions in which the laser radiation is irradiated.

According to at least one embodiment, a width of the strip in the separation regions, in which the semiconductor layer sequence is removed, or of the separation regions themselves, is at least 1 µm or 2.5 µm or 5 µm or 7.5 µm. Alternatively or in addition, this width amounts to at most 35 µm or 20 µm or 15 µm.

According to at least one embodiment, when viewed in plan view onto a main radiation side the optoelectronic semiconductor chips each comprise at least two corners, at which edges of the semiconductor chips meet at an angle≠90°. Preferably, this angle deviates from 90° by at least 15°, 25° or 35° and/or by at most 75°, 65° or 55°. In other words, the semiconductor chips then do not have a rectangular basic shape when viewed in plan view. For example, the basic shape of the semiconductor chips is triangular or hexagonal. Round basic shapes, which do not correspond to any polygonal chain, are also feasible.

According to at least one embodiment, in step C) side faces of the carriers are provided with roughening. The side faces are, for example, those boundary faces of the carrier which define the carrier in directions transverse to a growth direction of the semiconductor layer sequence. The side faces may in each case be provided completely or also only in part with roughening. It is additionally possible for only some of the side faces or all the side faces to be roughened.

According to at least one embodiment, the roughening is designed to improve the efficiency of light outcoupling from the carrier. To this end, the roughening preferably has an average roughness, also known as $R_a$, of at least 0.25 µm or 0.5 µm. Alternatively or in addition, the average roughness is at most 5 µm or 3 µm or 2 µm.

According to at least one embodiment, the side faces of the carriers are smooth. Smooth may mean that the average roughness amounts to less than a peak wavelength of the radiation generated when the semiconductor chip is in operation. For example, the average roughness is then at most 0.5 µm or 0.25 µm or 0.12 µm. A mirror layer may in particular be applied to such smooth side faces.

According to at least one embodiment, the laser radiation is guided in the separation regions in a zigzag pattern. In other words, the individual laser pulses do not then lie in a straight line and/or not in a common plane. The separation region may take the form of a three-dimensional zigzag pattern. The term three-dimensional zigzag pattern may mean that the laser radiation is guided similarly to the surface of a convoluted foam or an egg box. Such three-dimensional structures, whose main directions of extension lie along the separation regions, can be achieved specifically by an ISLE method. In particular, the roughening at the side faces may be produced by such guidance of the laser pulses.

According to at least one embodiment, the separation regions, when viewed in cross-section parallel to the growth direction of the semiconductor layer sequence, have an angle≠0° to the growth direction of the semiconductor layer sequence. In other words, the separation regions are then arranged at an angle to the growth direction. It is possible for precisely one angle of the separation regions to the growth direction to be present per side face or for the side faces to have a plurality of portions with different angles in the growth direction. Curved and non-planar regions of the side faces are also feasible.

According to at least one embodiment, the angle of the separation regions to the growth direction is at least 10° or 15° or 25° or 35°. Alternatively or in addition, this angle amounts to at most 80° or 75° or 65° or 55°.

According to at least one embodiment, the separation regions have a V shape when viewed in cross-section parallel to the growth direction of the semiconductor layer sequence. In other words, the separation regions are then composed of at least two sub-regions, which have an average angle to one another of >0°. Such separation regions allow semiconductor chips with a trapezoidal cross-section to be achieved. A tip of the V shape of the separation regions points from a back of the carrier assembly preferably towards the semiconductor layer sequence and may touch an upper side of the carrier assembly to which the semiconductor layer sequence has been applied. It is moreover possible for the separation regions, when viewed in cross-section, to be symmetrical to the growth direction.

According to at least one embodiment, the separation regions completely penetrate the carrier assembly. This means in particular that the material modification in the separation regions then extends from the back to the upper side of the carrier assembly.

Alternatively, it is possible for the separation regions, and thus the material modifications, to extend only partly through the carrier assembly. For example, a depth of the separation regions, starting from the back and/or from the upper side, amounts to at least 5% or 10% or 15% or 20% or 35% or 50% or 65% of a thickness of the carrier assembly.

Alternatively or in addition, this depth is at most 90% or 75% or 60% or 40% or 20% or 10% of the thickness, starting from the back and/or from the upper side.

If the separation regions do not extend completely through the carrier assembly, it is possible for a remaining residual thickness of the carrier not affected by the separation regions to be removed by a further material removal method. This further material removal method may remove a carrier material over the entire surface, in particular the entire back, or indeed only in places, for example, only close to the separation regions. The further material removal method, for example, comprises grinding or lapping. Singulation into semiconductor chips or into groups of semiconductor chips is then achievable by means of this further material removal method.

According to at least one embodiment, the laser radiation is irradiated in from the back of the carrier assembly remote from the semiconductor layer sequence. This makes it possible for no or no significant proportion of the laser radiation used to enter the semiconductor layer sequence.

According to at least one embodiment, a mirror layer is applied over the entire surface or in places on the back of the carrier assembly between the step of producing and the step of etching the material modifications. The mirror layer may comprise a metal mirror, for instance based on aluminum or silver, or indeed a Bragg mirror with a sequence of layers with an alternately low and high refractive index.

According to at least one embodiment, the mechanical integrity of the carrier assembly is not destroyed in the step of producing the material modifications by laser radiation. It is then possible for the strength of the carrier assembly to be reduced by the laser radiation at most to such an extent that the carrier assembly can still be handled as a coherent workpiece. This reduces production costs. The possibility of using temporary auxiliary carriers to stabilize the carrier assembly mechanically is not ruled out.

According to at least one embodiment, island-like material modifications are produced, calculated per pulse of laser radiation. The volume of the material modification produced per pulse amounts, for example, to at least 0.05 $\mu m^3$ or 0.8 $\mu m^3$ or 5 $\mu m^3$ and/or at most 100 $\mu m^3$ or 50 $\mu m^3$ or 25 $\mu m^3$ or 10 $\mu m^3$.

As a result of these comparatively small volumes, the separation region may be formed in a targeted and precise manner. The size of the volume is adjustable, for example, by the focusing strength of the laser radiation, and by the pulse durations and pulse energies used.

According to at least one embodiment, a power density of the laser radiation during the material modification has a value of at least $2\times10^{13}$ W/cm$^2$ or $5\times10^{13}$ W/cm$^2$. Alternatively or in addition, the power density is at most $1\times10^{15}$ W/cm$^2$ or $5\times10^{14}$ W/cm$^2$ or $2.5\times10^{14}$ W/cm$^2$.

According to at least one embodiment, an average pulse duration of the pulses of the laser radiation is at most 50 ns or 15 ns or 5 ns. Furthermore, the pulse duration may be at most 1 ns or 500 ps or 5 ps. Alternatively or in addition, the average pulse duration amounts to at least 50 fs or 1 ps or 10 ps or 750 ps.

According to at least one embodiment, the wet chemical etching proceeds with a hydrofluoric acid/water mixture. The proportion of hydrofluoric acid, FH for short, is for example, at least 15% or 30% and/or at most 70% or 60%. Depending on the thickness of the carrier assembly in this method step, an etching duration may amount to several hours. Specific alkalies may also be used as an alternative to hydrofluoric acid.

According to at least one embodiment, prior to the division step the carrier assembly is thinned, for instance by grinding. The thickness of the carrier assembly in the finished semiconductor chip and preferably in the division step is preferably at least 50 μm or 80 μm or 100 μm and/or at most 500 μm or 300 μm or 200 μm or 150 μm. By thinning prior to the division step, the etching time can be reduced.

According to at least one embodiment, the crystal quality of the sapphire is reduced during exposure to the laser pulses. In particular, the laser radiation transforms the crystalline sapphire into amorphous aluminum oxide or polycrystalline aluminum oxide with a small grain size. This transformation makes selective etching possible, since the material with the reduced crystal quality may have a stability relative to etching materials which is several orders of magnitude lower than that of sapphire itself.

According to at least one embodiment, a mirror is applied to each of the side faces of the carriers. The mirror may be a metallic mirror such as a silver mirror or an aluminum mirror. Likewise, layer stacks of transparent materials with alternating refractive indices, in particular in the form of a Bragg mirror, may be used. A combination of a layer of a material with a low refractive index and a metal mirror applied thereto may also be used. Such a mirror may optionally also be mounted on side faces of the semiconductor layer sequence, on a side of the semiconductor layer sequence remote from the carrier and/or on the back of the carrier assembly.

According to at least one embodiment of the method, a potting body is produced after singulation into the semiconductor chips and preferably prior to removal of the auxiliary carrier. The potting body may be a contiguous, one-piece body for instance of a thermoplastic material. The potting body may partially or completely surround the singulated semiconductor chips. In addition, the potting body may connect the semiconductor chips together mechanically. The main radiation side preferably remains free of the potting body. After construction of the potting body, the auxiliary carrier may be removed.

According to at least one embodiment, the potting body is subdivided, resulting in a plurality of semiconductor components. The semiconductor components each comprise one or more of the semiconductor chips. In addition, the semiconductor components each comprise part of the potting body.

An optoelectronic semiconductor chip is additionally provided. The optoelectronic semiconductor chip is produced using a method as indicated in conjunction with one or more of the above-stated embodiments. Features of the method are therefore also disclosed for the semiconductor chip and vice versa.

In at least one embodiment, the semiconductor chip comprises a semiconductor layer sequence based on AlInGaN, which comprises at least one active zone for generating radiation. The semiconductor layer sequence is grown on a carrier of sapphire. Side faces of the carrier comprise roughening in places or over the entire surface. The semiconductor layer sequence is spaced from the side faces.

BRIEF DESCRIPTION OF THE DRAWINGS

A method described here and an optoelectronic semiconductor chip described here will be explained in greater detail below with reference to the drawings and with the aid of exemplary embodiments. Elements which are the same in the individual Figures are indicated with the same reference numerals. The relationships between the elements are not shown to scale, however, but rather individual elements may be shown exaggeratedly large to assist in understanding.

In the drawings:

FIG. 1, which includes FIGS. 1A-1F, FIG. 4, which includes FIGS. 4A-4H, and FIG. 5, which includes

DETAILED DESCRIPTION OF ILLUSTRATIVE EMBODIMENTS

FIG. 1 illustrates a method for producing an optoelectronic semiconductor chip 10. According to FIG. 1A, a carrier assembly 11 is provided. The carrier assembly 11 comprises a sapphire wafer. For mechanical support, temporary auxiliary carriers, not shown, may be used in each case in the method step according to FIG. 1A or indeed in subsequent method steps.

Figure 1A:
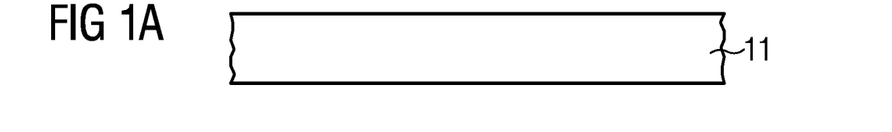
Figure 1B:
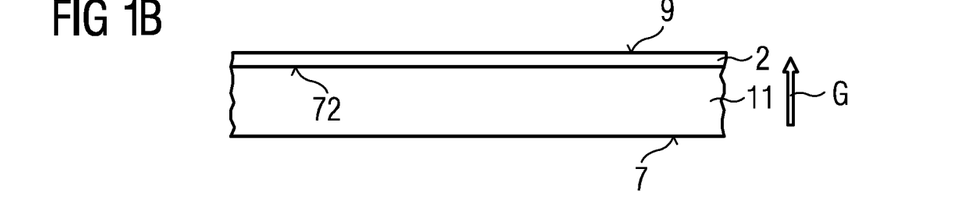

In the method step as shown in FIG. 1B, a semiconductor layer sequence 2 is grown epitaxially on an upper side 72 opposite a back 7. A growth direction G of the semiconductor layer sequence 2 is oriented perpendicular to the upper side 72. The semiconductor layer sequence 2 comprises at least one active zone for generating electromagnetic radiation, in particular visible light. The semiconductor layer sequence 2 is based on AlInGaN.

On a side remote from the carrier assembly 11 the semiconductor layer sequence 2 comprises a main radiation side 9. It is possible for patterning for improving light outcoupling to be produced on the main radiation side 9 in the method step according to FIG. 1B or in a subsequent method step. The semiconductor layer sequence 2 extends continuously over the entire carrier assembly 11 and in a material composition identical within the bounds of manufacturing tolerances.

Figure 1C:
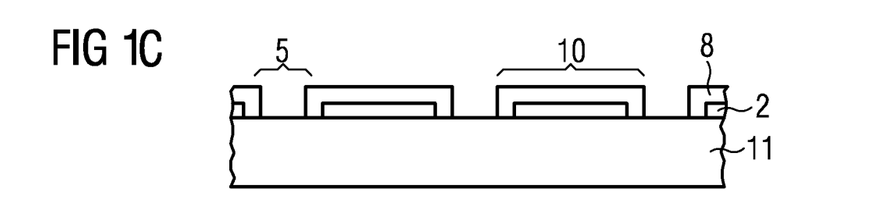

In the method step according to FIG. 1C, the semiconductor layer sequence 2 is removed in regions 5. In these regions 5, singulation into the semiconductor chips 10 is carried out in subsequent method steps. The regions 5 surround the sub-areas of the semiconductor layer sequence 2 produced in this method step preferably in each case on all sides in the manner of a frame. A width of the regions 5 is in particular at most 20 μm. A thickness of the semiconductor layer sequence 2 in the growth direction G is, for example, at least 2 μm and/or at most 12 μm.

A protective layer 8 may optionally be applied to the patterned semiconductor layer sequence 2. The protective layer 8 may be a temporary protective layer which is removed in a subsequent method step. It is likewise possible for the protective layer 8 to remain permanently on the semiconductor layer sequence and in the finished semiconductor chip 10. Unlike in the illustration, a plurality of protective layers may also be applied as a stack. Likewise at variance with the illustration, it is not absolutely essential for the protective layer 8 to leave out regions between the sub-areas with the semiconductor layer sequence 2. The protective layer 8 is designed to protect the semiconductor layer sequence 2 from mechanical damage, from soiling and in particular from an etchant, which is used in a subsequent singulation step. At variance with the illustration, it is also possible for the semiconductor layer sequence 2 to extend as far as the separation regions S.

In an optional method step, not shown, the carrier assembly 11 may, for example, be thinned by grinding. Furthermore, means for electrically contacting the semiconductor layer sequence 2 may be mounted on the semiconductor layer sequence 2 and/or the carrier assembly 11. To simplify the illustrations, electrical contact means such as conductor tracks or bond pads are respectively not shown.

Figure 1D:
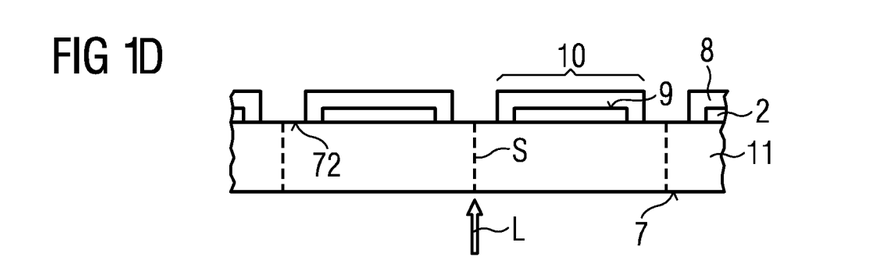

In the method step according to FIG. 1D, pulsed laser radiation L, symbolized by an arrow, is preferably irradiated into separation regions S from the back 7. The separation regions S penetrate the carrier assembly 11 preferably completely and are furthermore preferably spaced from the semiconductor layer sequence 2. The separation regions S are located on the upper side 72 in the regions 5 in which the semiconductor layer sequence 2 has been removed.

Each pulse of laser radiation L modifies a specific focus volume in the carrier assembly 11. For example, the sapphire of the carrier assembly 11 is transformed by laser radiation L locally in the focus volume into amorphous aluminum oxide, which is more readily etchable. The separation regions S are scanned by the individual pulses of laser radiation L. Through this scanning the morphology of the separation regions S is very largely freely determinable.

The laser radiation L has a wavelength for which the carrier assembly 11 and preferably also the semiconductor layer sequence 2 and the protective layer 8 are transmissive. The mechanical integrity of the carrier assembly 11 is preferably not significantly impaired by the laser radiation L, such that the carrier assembly 11 remains handleable as a whole even after the step according to FIG. 1D.

Figure 1E:
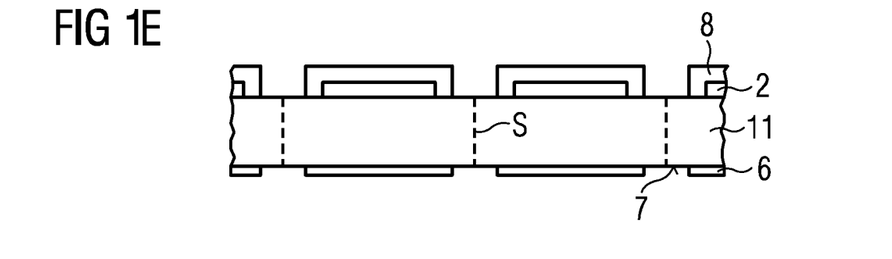

In the optional method step as shown in FIG. 1E, a mirror layer 6 is applied in places on the back 7. Individual sub-areas of the mirror layer 6 are assigned in a one-to-one relationship to the sub-areas of the semiconductor layer sequence 2. The separation regions S are free of the mirror layer 6. It is possible for the mirror layer 6 in each case to project beyond the semiconductor layer sequence 2 in a lateral direction. At variance with the illustration, the mirror layer 6 may also be applied continuously to the back 7. A further protective layer which is not shown may moreover optionally be located on the mirror layer 6 in order to prevent damage to the mirror layer, for instance during wet chemical etching. Such a mirror layer 6 and/or such a further protective layer may also be present in all the other exemplary embodiments.

Figure 1F:
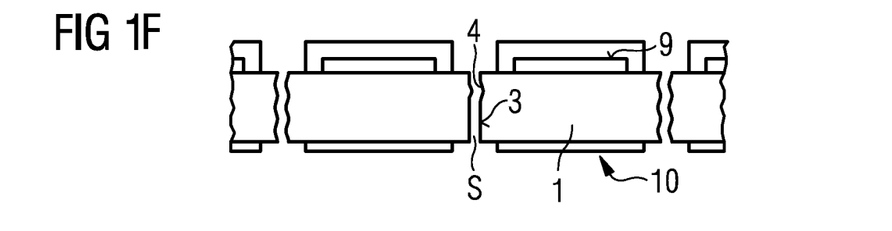

Division into the individual semiconductor chips 10 takes place as illustrated in FIG. 1F. Through wet chemical etching, in particular using hydrofluoric acid, the material modified by the laser radiation L is etched away in the separation regions S. The etched-away areas have the same shape which was scanned with the pulses of laser radiation L in the method step according to FIG. 1D.

Through such etching, roughening 4 may be purposefully achieved at side faces 3 of the individual carriers 1 of the semiconductor chips 10. This roughening 4 allows the efficiency of light outcoupling out of the semiconductor chips 10 to be increased.

FIG. 2 shows in each case schematic plan views of semiconductor chips 10 prior to singulation. Semiconductor chips 10 may be produced in principle with any desired base areas, when viewed in plan view, by the method as illustrated in conjunction with FIG. 1. In particular, it is not necessary to comply with the crystal orientations needed for breaking.

Figure 2A:
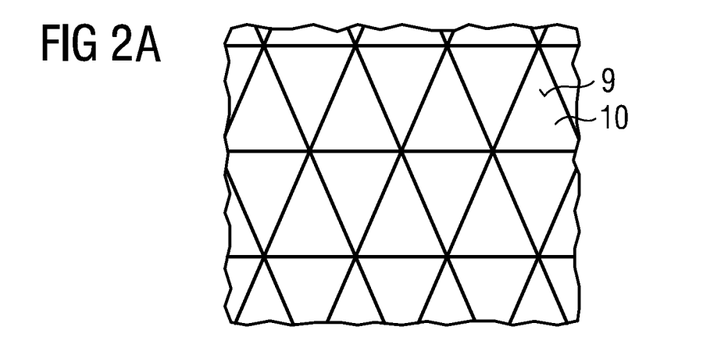
FIGS. 2A-2D, shows schematic plan views of exemplary embodiments of optoelectronic semiconductor chips described here, and FIG. 3, which includes
Figure 2B:
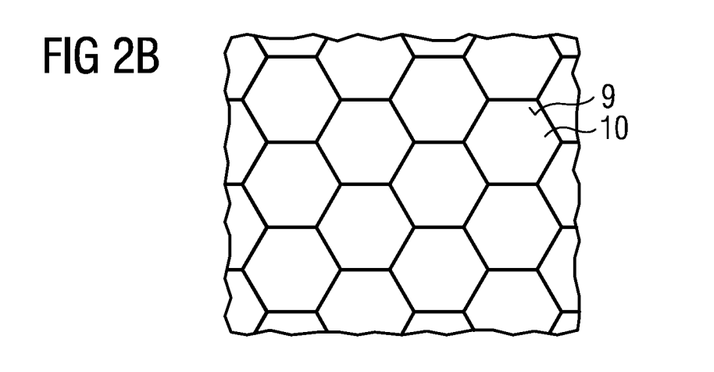
Figure 2C:
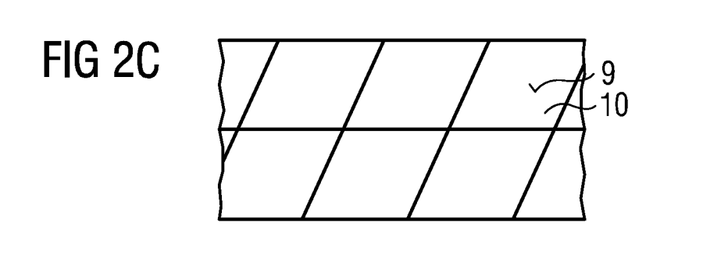

According to FIG. 2A, the semiconductor chips 10 have a triangular basic shape. FIG. 2B shows a hexagonal basic shape and FIG. 2C a parallelogram-shaped basic shape.

Figure 2D:
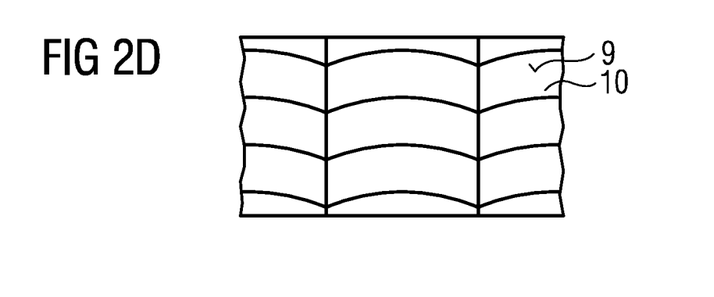

Unlike in these figures, it is not necessary, see, e.g., FIG. 2D, for the semiconductor chips 10 to have edges and boundary faces extending in straight lines, when viewed in plan view. The semiconductor chips 10 according to FIG. 2D are for instance arcuate. Such semiconductor chips 10 may be used in automotive headlights, for example.

The basic shape of the semiconductor chips 10 is in each case preferably selected such that a high fullness factor is feasible. This is the case with each of the base areas shown. The manufacturing costs may thereby be reduced.

FIG. 3 shows cross-sections of semiconductor chips 10 as produced using the method according to FIG. 1. According to FIG. 3A, the semiconductor chips 10 each comprise a trapezoidal cross-section. The separation regions S are V-shaped and point towards the semiconductor layer sequence 2. Through such shaping it is possible on the one hand to achieve a high fullness factor of the semiconductor layer sequence 2 on the sapphire-growth substrate.

Figure 3A:
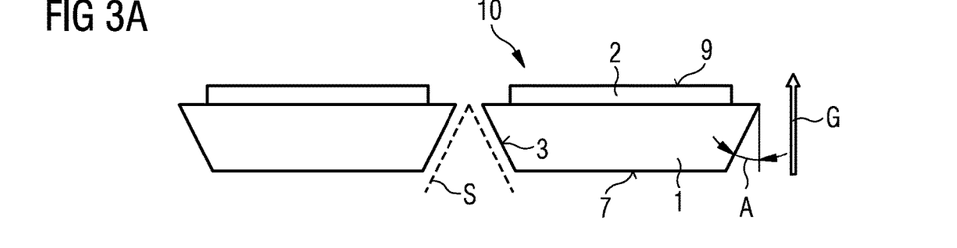
FIGS. 3A-3D, shows schematic sectional representations of exemplary embodiments of optoelectronic semiconductor chips described here.

On the other hand, an elevated outcoupling efficiency may be achieved by an angle A of ≠0° to the growth direction G.

Figure 3B:
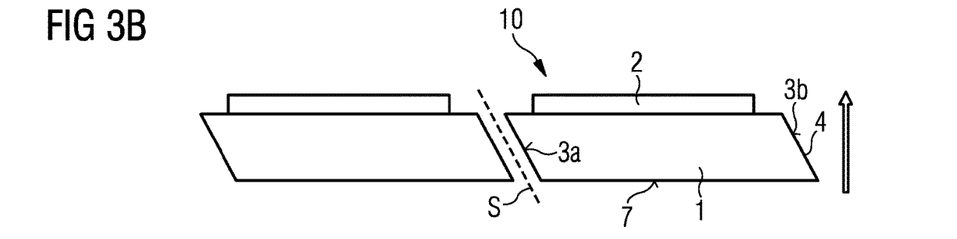

According to FIG. 3B the semiconductor chips 10 comprise a parallelogram-shaped cross-section. As also in all the other exemplary embodiments, it is possible for just some side faces 3b of the carrier 1 to be provided with the roughening 4 and not other side faces 3a. Unlike in the illustration, however, the side face 3a may also be provided with the roughening 4. The same is true of all the other exemplary embodiments. The separation regions S are straight-line portions when viewed in cross-section.

Figure 3C:
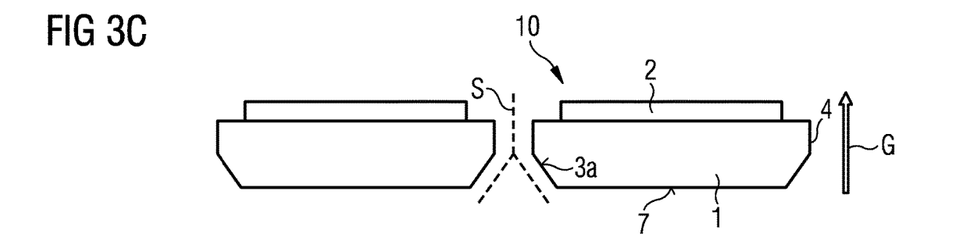

In the case of the semiconductor chips 10 as illustrated in FIG. 3C, the side faces 3 comprise a first region, which is oriented parallel to the growth direction G, and a second region, which is inclined to the growth direction G. One or both of these regions may be provided with roughening 4. When viewed in cross-section, the separation region S then takes the form of a Y, wherein the opening of the Y points towards the back 7.

Figure 3D:
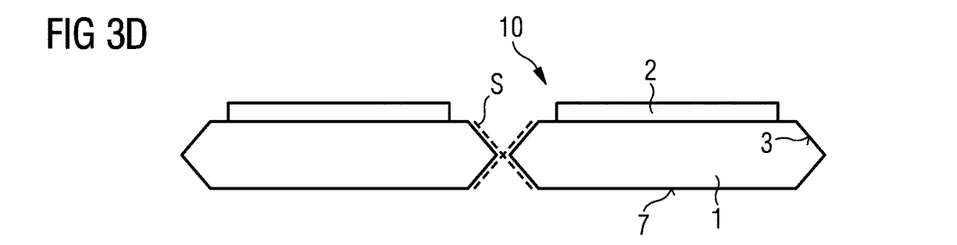

In the exemplary embodiment according to FIG. 3D, the separation region S takes the form of an X, when viewed in cross-section. In other words, in the direction away from the back 7 a width of the carrier 1 firstly increases and then decreases.

Such variably shaped side faces 3 may be produced by the method according to FIG. 1, in particular by scanning with the laser radiation L and subsequent etching.

FIG. 4 shows a further exemplary embodiment of a method for producing optoelectronic semiconductor chips 10. The carrier assembly 11 is provided according to FIG. 4A. Moreover, the semiconductor layer sequence 2 with the at least one active layer is applied contiguously over the entire surface of the upper side 72.

Figure 4A:
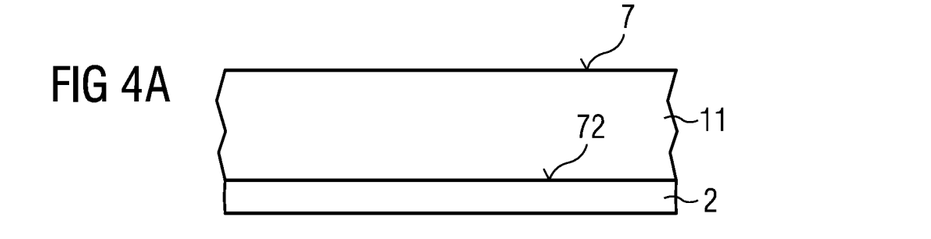
Figure 4B:
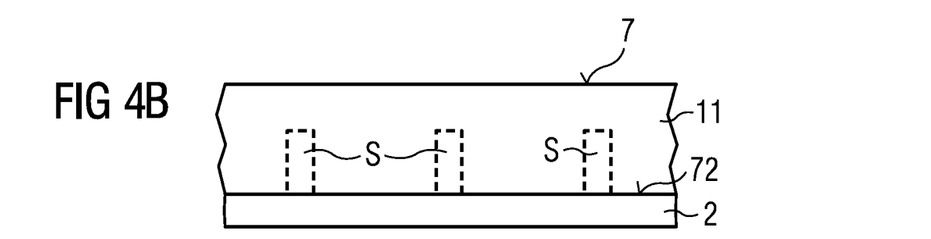

FIG. 4B shows that a plurality of the separation regions S are formed in the carrier assembly 11. The separation regions S extend away from the upper side 72 towards the back 7. Starting from the upper side 72, the separation regions S each extend, for example, by at least 50 µm or 100 µm and/or by at most 200 µm or 150 µm or 100 µm into the carrier assembly 11. The thickness of the carrier assembly 11 as a whole is, for example, at least 250 µm or 400 µm and/or at most 2 mm or 1.3 mm or 1 mm or 750 µm or 500 µm. The separation regions S are produced as described in association with FIG. 1D. Laser radiation is preferably irradiated from the back 7 into the carrier assembly 11.

Figure 4C:
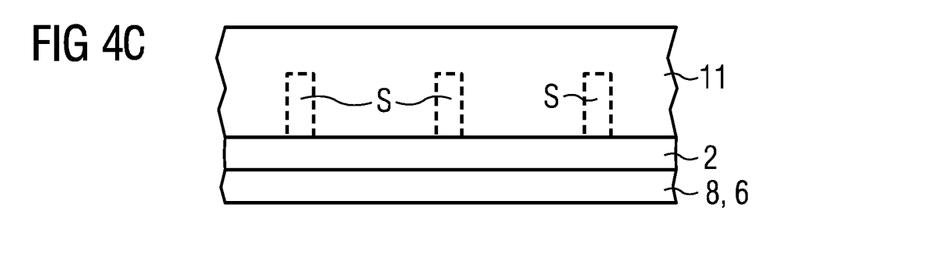

In the method step according to FIG. 4C, the protective layer 8 and optionally the mirror layer 6 are mounted on a side of the semiconductor layer sequence 2 remote from the carrier assembly 11. The protective layer 8 and/or the mirror layer 6 may also be patterned to yield electrical connections, rewiring layers or electrical lands or corresponding, additional elements may be applied. An electrical interconnection between adjacent regions of the semiconductor layer sequence 2 may also be provided for adjacent semiconductor chips 10.

Figure 4D:
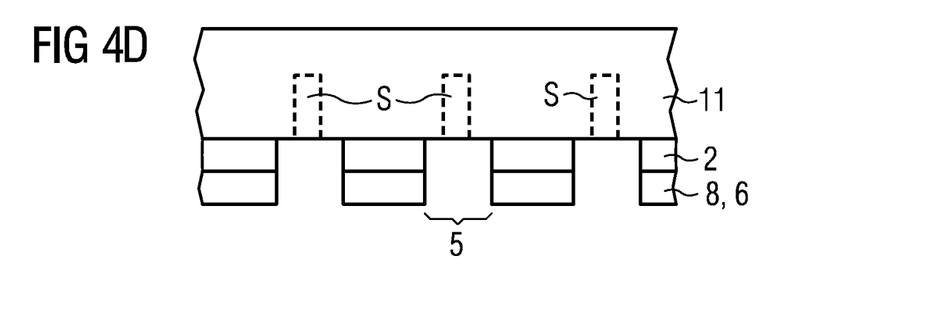

According to FIG. 4D, the semiconductor layer sequence 2 and the protective layer 8 and the mirror layer 6 are removed in one region 5, for example, by means of etching. This step may proceed in a manner similar to FIG. 1C. The region 5 extends laterally preferably beyond the separation region S. In an additional step, not shown, further layers may also be produced at the region 5 and at exposed side faces of the semiconductor layer sequence 2, for example, encapsulation layers and/or electrical insulation layers.

Figure 4E:
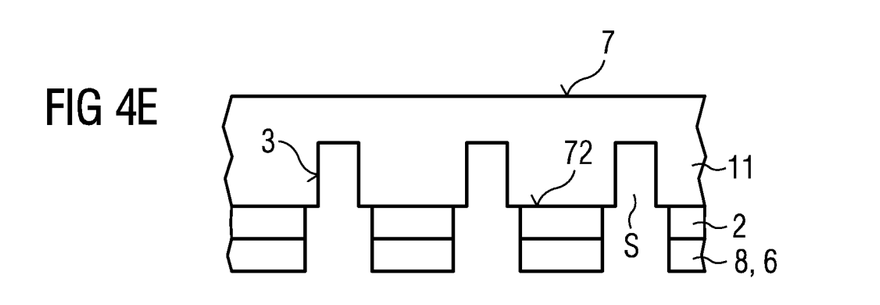

Etching of the separation regions S proceeds in FIG. 4E. This step is preferably performed in a manner similar to the method step in FIG. 1F. As shown in FIG. 4E, the carrier assembly 11 is not completely divided in this etch step. Preferably, a sufficient thickness of the carrier assembly 11 remains at the separation regions S, such that the carrier assembly 11 is mechanically stable and self-supporting and handleable without an auxiliary carrier even after material has been removed from the separation regions S.

Unlike what is shown in FIG. 4E, it is not essential to supply an etchant from the upper side 72. In this case, the separation regions S do not then preferably extend as far as the upper side 72. An etchant may then be supplied from the back 7 through holes. Etching of the separation regions S does not necessarily have to proceed directly after formation of the separation regions S, see FIG. 4B; rather, further process steps may be interposed, as shown.

Figure 4F:
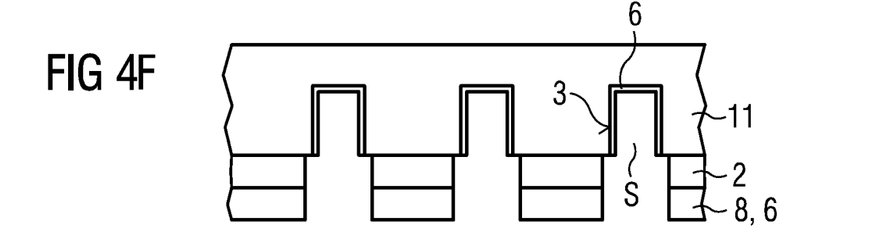

In the method step as shown in FIG. 4F, a further mirror layer 6 is applied to the side faces 3 of the subsequent carriers 1 in the separation regions S. The further mirror layer 6 may be applied to all the areas which have been exposed by material removal in the separation regions S. Unlike in the illustration, it is also possible for the further mirror layer 6 to extend onto side faces of the semiconductor layer sequence 2 and/or onto exposed regions of the protective layer 8. The further mirror layer 6 may be a metal mirror. It is likewise possible for a composite of a layer of a material with a low refractive index to be applied in combination with a metal layer as a further mirror layer 6. To achieve high reflectivity of the further mirror layer 6, according to FIG. 4F the side faces 3 are preferably smooth.

At variance with the illustration in FIG. 4F, further layers may also be applied in the separation regions S, for example, protective layers against mechanical damage, against process chemicals or against harmful environmental influences. Corresponding additional protective layers, not shown, may also extend onto the semiconductor layer sequence 2 or onto the mirror 6 on the semiconductor layer sequence 2. Such layers may be produced with coating methods which allow diffusion into the smallest crevices, such as vapor phase deposition or atomic layer deposition, or ALD for short. Alternatively, physical vapor phase deposition may be used. Additional metal layers may also be applied using electrochemical deposition, if an electrically conductive, in particular thin base layer is present.

Figure 4G:
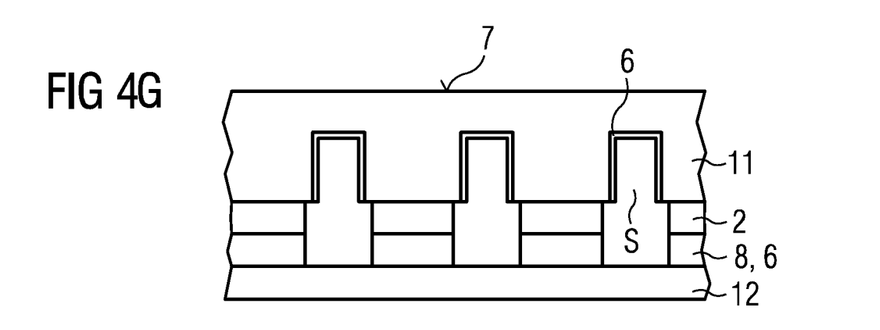

FIG. 4G shows that an auxiliary carrier 12 is mounted on a side of the semiconductor layer sequence 2 remote from the carrier assembly 11. The auxiliary carrier 12, for example, comprises a film or a plate. The auxiliary carrier 12 may be mechanically flexible or indeed mechanically rigid.

Figure 4H:
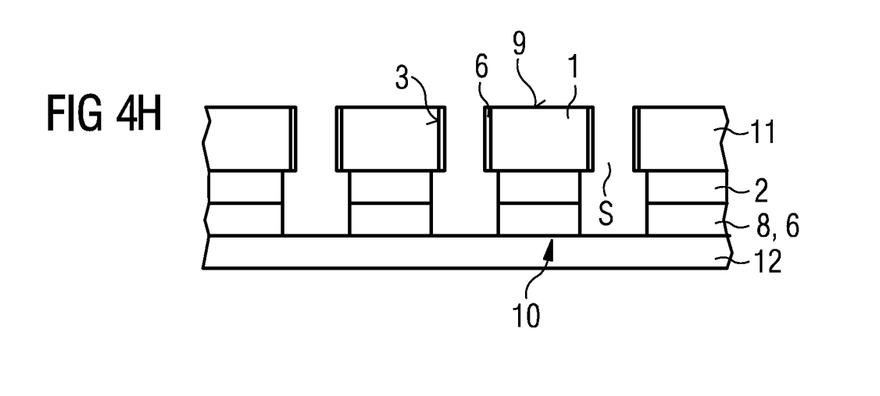

According to the method step, as illustrated in FIG. 4H, the carrier assembly 11 is removed from the back 7, for example, by grinding or by lapping. The carrier assembly 11 is removed over the entire surface until the semiconductor chips 10 have been singulated. In other words, thinning is performed at least as far as into the separation regions S. Unlike in the illustration according to FIG. 4H, it is also possible for a plurality of sub-regions of the semiconductor layer sequence 2 to be combined into a group on a common carrier 1.

Due to the further mirror layer 6 at the side faces 3 of the carriers 1, the resultant semiconductor chips 10 emit the radiation generated during operation via the carrier 1. It is possible for radiation generated during operation to be emitted solely at the main radiation side 9 formed by the carrier 1. Since, during production, the separation regions S only make up a comparatively small proportion of the thickness of the carrier assembly 11, construction of an auxiliary carrier prior to the singulation step can be omitted, which brings about a cost reduction.

The semiconductor chips 10, as also in all the other exemplary embodiments, in particular are flip chips, which may be electrically contacted and mechanically mounted solely via a side opposite the main radiation side 9. As a result in particular of the flip chip configuration, it is also possible to achieve good dissipation of waste heat out of the semiconductor chips 10.

Optionally, the side denoted in FIG. 4H as the main radiation side may additionally also be provided with a mirror layer 6. The main radiation side is then the side of the semiconductor layer sequences 2 remote from the carriers 1, which side is then preferably free of a reflective layer. It is moreover possible for the semiconductor chips 10 to take the form of side emitters, also known as side lookers. In this case, preferably both main sides of the semiconductor chips 10 are mirrored and all, one, two or three of the side faces 3 are free of the mirror layer and designed to emit radiation.

Figure 5A:
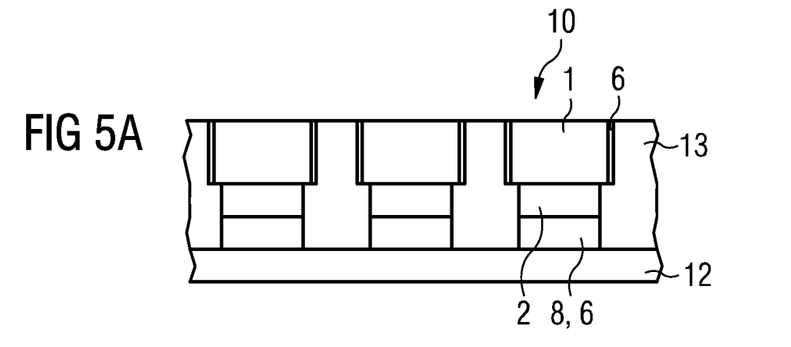
FIGS. 5A-5b, are schematic, sectional representations of methods described here for producing optoelectronic semiconductor chips described here, FIG. 2, which includes

If the semiconductor chips 10 take the form of flip chips, the semiconductor chips 10 may, for example, also be provided with solder-coated contact electrodes prior to application of the auxiliary carrier 12, in particular since an injection molding temperature for instance during potting with a material as shown in FIG. 5A may be kept below a solidus temperature of a solder.

The auxiliary carrier 12 is then preferably removed. As shown in FIG. 5A, it is optionally possible, prior to removal of the auxiliary carrier 12, for a potting compound 13 to be injection-molded around the semiconductor chips 10 and/or for a conversion medium, not shown, to be applied over the main radiation sides 9 for complete or partial conversion of the radiation generated in the semiconductor layer sequence 2 into radiation of another wavelength. If the individual semiconductor chips 10 are injection-molded or press-molded with the potting compound 13, the separation regions S may have a comparatively large width, in order to simplify separation into individual, surface-mountable semiconductor components 30 after potting of the semiconductor chips 10.

Figure 5B:
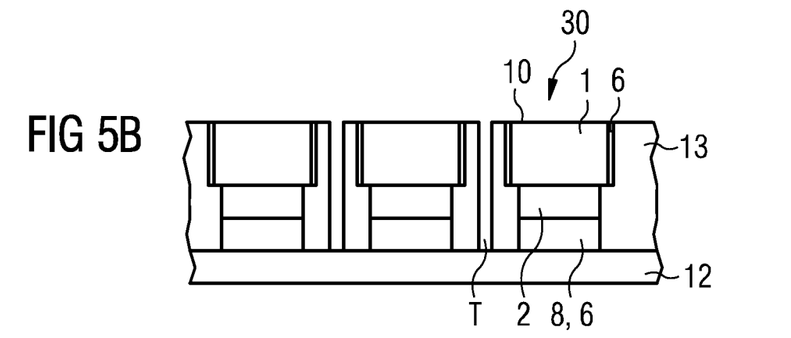

Singulation into the semiconductor components 30 proceeds, for example, by sawing between adjacent semiconductor chips 10 in sawing lines T, see FIG. 5B. Because in particular of the fine patterning options for the separation regions S using the laser etching method described in relation to FIG. 1, such a sawing line T may be kept comparatively narrow, whereby the yield of semiconductor components 30 per carrier assembly 11 is increased, combined with a reduction in the manufacturing costs of the semiconductor chips.

As also in all the other exemplary embodiments, it is possible for more than one auxiliary carrier to be used. For example, after singulation into the semiconductor chips 10 or into the semiconductor components 30, a plurality of the semiconductor chips 10 or of the semiconductor components 30 are combined on a further auxiliary carrier. These combined semiconductor chips 10 or semiconductor components 30 are then sorted in particular according to various criteria, for example, with regard to emission wavelength or spectral composition of an emitted radiation. It is thus possible for all the semiconductor chips 10 or semiconductor components 30 on the auxiliary carrier 12 and/or on the further auxiliary carrier to belong to a common class of criteria.

Using such a method, as illustrated in conjunction with FIGS. 4 and 5, semiconductor chips 10 and semiconductor components 30 may be produced which have a sapphire carrier substrate 1 with mirrored side faces 3. The resultant semiconductor chips or semiconductor components 30 have comparatively small lateral dimensions. Using potting, as explained in relation to FIG. 5A, it is in particular possible to achieve packaged semiconductor chips 10, the size of which does not differ greatly from the size of the semiconductor layer sequence 2, when viewed in plan view. Such configurations are also known as chip size packages. This configuration may be produced while still in the wafer assembly, as shown in FIG. 5A.

Since the side faces 3 of the carriers 1 are provided with a reflective coating, potting compounds may additionally be used for the potting body 13 which have only relatively low reflectivity. In particular, black potting compounds may be used, which are used for instance in the production of integrated circuits or ICs for short.

As an alternative to potting of the semiconductor chips 10 while still in the wafer assembly, it is also possible for the semiconductor chips 10 shown in conjunction with FIG. 4H to be applied directly to a printed circuit board, without the need for an additional packaging or potting body. Such an arrangement is also known as chip-on-board.

The invention described here is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. A method for producing a plurality of optoelectronic semiconductor chips, the method comprising:
   providing a carrier assembly comprising is a sapphire wafer;
   applying a semiconductor layer sequence to the carrier assembly, the semiconductor layer sequence having an active zone for generating electromagnetic radiation during operation; and
   dividing the carrier assembly and the semiconductor layer sequence into individual semiconductor chips or into groups of semiconductor chips in separation regions between adjacent semiconductor chips or groups of semiconductor chips, wherein dividing comprises:
   producing a plurality of selectively etchable material modifications in the carrier assembly in the separation regions by focused, pulsed laser radiation, wherein the laser radiation has a wavelength at which the carrier assembly is transparent; and subsequently wet chemical etching the material modifications, wherein the carrier assembly is singulated into individual carriers for the semiconductor chips or for the groups of semiconductor chips by the wet chemical etching in combination with a further material removal method, wherein smooth side faces of the carriers are formed while dividing the carrier assembly by the separation regions, wherein the separation regions do not penetrate right through the carrier assembly, wherein, once the side faces have been produced, at least one mirror layer is applied to the side faces in the separation regions, wherein a temporary auxiliary carrier is mounted on a side of the semiconductor layer sequence remote from the carrier assembly, and wherein, once the auxiliary carrier has been mounted, singulation proceeds with the further material removal method and the further material removal method is grinding or lapping.

2. The method according to claim 1, wherein the semiconductor layer sequence is based on AlInGaN and grown epitaxially onto the carrier assembly, wherein the semiconductor layer sequence is partially or completely removed from the separation regions prior to dividing the carrier assembly, and wherein after the wet chemical etching, when viewed in plan view, each semiconductor chip comprises two corners, at which edges of the semiconductor chips meet at an angle other than 90°.

3. The method according to claim 1, wherein a region at the separation regions in which the semiconductor layer sequence is removed prior to dividing the carrier assembly has a width of between 1 µm and 20 µm inclusive.

4. The method according to claim 1, further comprising:

after the singulation and prior to removal of the auxiliary carrier, forming a contiguous potting body that completely surrounds each of the individual semiconductor chips or the groups of semiconductor chips and connects them together mechanically;

subdividing the potting body, such that a plurality of semiconductor components are formed with at least one of the semiconductor chips configured as flip chips and with part of the potting body; and removing the auxiliary carrier.

5. The method according to claim 1, wherein the laser radiation is guided in the separation regions in a two-dimensional zigzag pattern.

6. The method according to claim 1, wherein the separation regions extend, when viewed in cross-section, at an angle other than 0° to a growth direction of the semiconductor layer sequence.

7. The method according to claim 6, wherein the angle is between 15° and 75° when producing the etchable material modifications.

8. The method according to claim 1, wherein the separation regions, when viewed in cross-section, are V-shaped and symmetrical relative to a growth direction.

9. The method according to claim 1, wherein the laser radiation is irradiated in from a back of the carrier assembly remote from the semiconductor layer sequence, and wherein a mechanical integrity of the carrier assembly is maintained while producing the selectively etchable material modifications.

10. The method according to claim 1, wherein the material modifications have a volume of between 0.25 µm$^3$ and 50 µm$^3$ inclusive per pulse of the laser radiation, wherein during the material modifications a power density of the laser radiation is between $2\times10^{13}$ W/cm$^2$ and $5\times10^{14}$ W/cm$^2$ inclusive, wherein an average pulse duration of the pulses of the laser radiation is at most 50 ns, and wherein the wet chemical etching utilizes hydrofluoric acid.

11. The method according to claim 1, further comprising, prior to dividing the carrier assembly, thinning the carrier assembly, such that a thickness of the carrier assembly after thinning is between 80 µm and 300 µm inclusive.

12. The method according to claim 1, wherein, by pulses of the laser radiation, island-like material modifications are produced with a reduced crystal quality compared with non-irradiated parts of the carrier assembly, and wherein adjacent material modifications overlap or touch one another.

* * * * *

UNITED STATES PATENT AND TRADEMARK OFFICE
CERTIFICATE OF CORRECTION

PATENT NO. : 9,680,049 B2  
APPLICATION NO. : 14/773921  
DATED : June 13, 2017  
INVENTOR(S) : Andreas Ploessl Page 1 of 1

It is certified that error appears in the above-identified patent and that said Letters Patent is hereby corrected as shown below:

In the Claims

In Column 12, Line 52, Claim 1, delete "is".

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*